(12) United States Patent
Cai et al.

(10) Patent No.: US 11,238,259 B2
(45) Date of Patent: Feb. 1, 2022

(54) FINGERPRINT MODULE AND PREPARATION METHOD THEREOF, AND ELECTRONIC DEVICE AND PREPARATION METHOD THEREOF

(71) Applicant: SHENZHEN GOODIX TECHNOLOGY CO., LTD., Shenzhen (CN)

(72) Inventors: Jun Cai, Shenzhen (CN); Wei Ling, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 32 days.

(21) Appl. No.: 16/714,721

(22) Filed: Dec. 14, 2019

(65) Prior Publication Data

US 2020/0117875 A1    Apr. 16, 2020

Related U.S. Application Data

(63) Continuation of application No. PCT/CN2018/102035, filed on Aug. 23, 2018.

(51) Int. Cl.
    *G06K 9/00*         (2006.01)

(52) U.S. Cl.
    CPC .................... *G06K 9/0002* (2013.01)

(58) Field of Classification Search
None
See application file for complete search history.

(56) References Cited

U.S. PATENT DOCUMENTS

| 2017/0213019 A1 | 7/2017 | Mao |
| 2018/0089492 A1 | 3/2018 | Cai |
| 2018/0365472 A1 | 12/2018 | Cai |

(Continued)

FOREIGN PATENT DOCUMENTS

| CN | 104133584 A | 11/2014 |
| CN | 106662900 A | 5/2017 |
| CN | 206546581 U | 10/2017 |

(Continued)

OTHER PUBLICATIONS

Screen fingerprint small science Can you actually see the fingerprint module under the screen?, Aug. 9, 2018, Retrieved from the Internet <URL: http://baijiahao.baidu.com/s?id=1608313244013040446>, together with an English language abstract.

(Continued)

*Primary Examiner* — Nicholas J Lee
(74) *Attorney, Agent, or Firm* — Scully Scott Murphy & Presser

(57) ABSTRACT

A fingerprint module and the preparation method thereof, and an electronic device and the preparation method thereof, which are beneficial to improving the performance of fingerprint identification. The fingerprint module includes a fingerprint sensor, wherein a first direction of the fingerprint module has a first angle with a first direction of the fingerprint sensor, the first direction of the fingerprint module is a direction parallel to a particular edge of the fingerprint module, and the first direction of the fingerprint sensor is a direction parallel to a particular edge of the fingerprint sensor.

16 Claims, 6 Drawing Sheets

(56) References Cited

U.S. PATENT DOCUMENTS

2019/0012512 A1* 1/2019 He .................. G06K 9/0004
2019/0080140 A1* 3/2019 Lee .................. H05K 1/189

FOREIGN PATENT DOCUMENTS

| CN | 107657240 A | 2/2018 |
| CN | 107958179 A | 4/2018 |
| CN | 108021860 A | 5/2018 |
| CN | 207557977 U | 6/2018 |
| CN | 108323207 A | 7/2018 |
| CN | 209570950 U | 11/2019 |

OTHER PUBLICATIONS

Xiaomi Mi 8 Explorer Edition Evaluation and Disassembly, Aug. 10, 2018, Retrieved from the Internet <URL: http://m.elecfans.com/article/724329.html>, together with an English language abstract.

Popular science the pressure-sensitive screen fingerprint of the Xiaomi Mi 8 Explorer Edition, Jul. 30, 2018, Retrieved from the Internet <URL: https://www.ithome.com/html/android/373613.htm>, together with an English language abstract.

Vivo NEX dismantling: the whole process takes three hours, the structure is complex and precise, Aug. 1, 2018, Retrieved from the Internet <URL: https://mobile.pconline.com.cn/1154/11547665.html>, together with an English language abstract.

Meizu 16th in-depth dismantling—the materials used for the people-friendly arcade are so particular, Aug. 22, 2018, Retrieved from the Internet <URL: https://baijiahao.baidu.com1s/?id=1609500103577766209&wfr=spider&for=pc>, together with an English language abstract.

Full HD video of Meizu 16 new product launch conference, Aug. 9, 2018, Retrieved from the Internet <URL: https://v.qq.com/x/page/h0750ep8m24.html>.

* cited by examiner

500

| Mounting a fingerprint sensor in the fingerprint module along a direction forming a first angle with a first direction of the fingerprint module, so that the first direction of the fingerprint sensor has a first angle with the first direction of the fingerprint module, wherein the first direction of the fingerprint module is a direction parallel to a particular edge of the fingerprint module, and the first direction of the fingerprint sensor is a direction parallel to a particular edge of the fingerprint sensor. |
|---|

| Mounting a fingerprint module below a display screen of the electronic device, so that a first direction of a fingerprint sensor in the fingerprint module has a first angle with a first direction of the display screen, the first direction of the fingerprint sensor is a direction parallel to a particular edge of the fingerprint sensor, and the first direction of the display screen is a direction parallel to a particular edge of the display screen. |
|---|

FINGERPRINT MODULE AND PREPARATION METHOD THEREOF, AND ELECTRONIC DEVICE AND PREPARATION METHOD THEREOF

CROSS REFERENCE TO RELATED APPLICATIONS

The present disclosure is a continuation of international application No. PCT/CN2018/102035 filed on Aug. 23, 2018, which is hereby incorporated by reference in its entirety.

TECHNICAL FIELD

The present application relates to the field of optical fingerprint technologies, and in particular, to a fingerprint module and a preparation method thereof, and an electronic device and a preparation method thereof.

BACKGROUND

An under-screen fingerprint module is subject to various light interferences during use. For example, for an organic light-emitting diode (OLED) screen, due to the structural of the OLED screen, Moire stripes may be generated when light passes through the display screen. In addition, a polarizer in the display screen may also significantly interfere with an optical signal input into the fingerprint module and affect the performance of fingerprint identification.

SUMMARY

The embodiments of the present application provide a fingerprint module and a preparation method thereof, and an electronic device and a preparation method thereof, which are beneficial to improving the performance of fingerprint identification.

In a first aspect, a fingerprint module is provided, including: a fingerprint sensor, wherein a first direction of the fingerprint module has a first angle with a first direction of the fingerprint sensor, the first direction of the fingerprint module is a direction parallel to a particular edge of the fingerprint module, and the first direction of the fingerprint sensor is a direction parallel to a particular edge of the fingerprint sensor.

Therefore, by setting a certain angle between the fingerprint sensor and the fingerprint module, there is also a certain angle between the fingerprint sensor and a display screen of the electronic device correspondingly in a case where the fingerprint module is mounted on the electronic device in parallel, so that it is possible to reduce the influence of a polarizer in the display on the optical signal, and at the same time reduce or eliminate Moire stripes, thereby improving the success rate of fingerprint identification.

In one possible implementation manner, the first angle is between −15 degrees and 15 degrees and is not equal to zero.

In one possible implementation manner, the first angle is between −45 degrees and 45 degrees and is not equal to zero.

In one possible implementation manner, in a case where the fingerprint module is mounted below a display screen of an electronic device, a first direction of the fingerprint module is parallel to a first direction of the display screen, wherein the first direction of the display screen is a direction parallel to a particular edge of the display screen.

In one possible implementation manner, the first angle is determined according to a polarization direction of a polarizer in the display screen.

In a second aspect, a fingerprint module is provided, including:
a fingerprint sensor;
wherein in a case where the fingerprint module is mounted below a display screen of an electronic device, a first direction of the fingerprint sensor in the fingerprint module has a first angle with a first direction of the display screen, the first direction of the fingerprint sensor is a direction parallel to a particular edge of the fingerprint sensor, and the first direction of the display screen is a direction parallel to a particular edge of the display screen.

In one possible implementation manner, a first direction of the fingerprint module is parallel to the first direction of the fingerprint sensor, wherein the first direction of the fingerprint module is a direction parallel to a particular edge of the fingerprint module.

In one possible implementation manner, a first direction of the fingerprint module is parallel to the first direction of the display screen, wherein the first direction of the fingerprint module is a direction parallel to a particular edge of the fingerprint module.

Therefore, by adjusting the angle of the fingerprint sensor in the fingerprint module relative to the fingerprint module, or by adjusting the angle of the fingerprint module relative to the display screen, the fingerprint sensor has a certain angle with the display screen, so that the effect of the polarizer on the optical signal input into the fingerprint module can be reduced, and the Moire stripes can also be reduced or eliminated, thereby improving the success rate of fingerprint identification.

In one possible implementation manner, the first angle is between −45 degrees and 45 degrees and is not equal to zero.

In one possible implementation manner, the first angle is between −15 degrees and 15 degrees and is not equal to zero.

In one possible implementation manner, the first angle is determined according to a polarization direction of a polarizer in the display screen.

In a third aspect, an electronic device is provided, including:
a display screen; and
a fingerprint module comprising a fingerprint sensor, wherein the fingerprint module is provided below the display screen;
wherein a first direction of the fingerprint sensor has a first angle with a first direction of the display screen, the first direction of the fingerprint sensor is a direction parallel to a particular edge of the fingerprint sensor, and the first direction of the display screen is a direction parallel to a particular edge of the display screen.

In one possible implementation manner, a first direction of the fingerprint module is parallel to the first direction of the display screen, and the first direction of the fingerprint module has the first angle with the first direction of the fingerprint sensor, wherein the first direction of the fingerprint module is a direction parallel to a particular edge of the fingerprint module.

In one possible implementation manner, a first direction of the fingerprint module is parallel to the first direction of the fingerprint sensor, and the first direction of the fingerprint module has the first angle with the first direction of the display screen, wherein the first direction of the fingerprint module is a direction parallel to a particular edge of the fingerprint module.

In one possible implementation manner, the first angle is between −45 degrees and 45 degrees and is not equal to zero.

In one possible implementation manner, the first angle is between −15 degrees and 15 degrees and is not equal to zero.

In one possible implementation manner, the first angle is determined according to a polarization direction of a polarizer in the display screen.

In a fourth aspect, a preparation method of a fingerprint module is provided, including: mounting the fingerprint sensor in the fingerprint module in a direction forming a first angle with a first direction of the fingerprint module, so that a first direction of the fingerprint sensor has the first angle with the first direction of the fingerprint module, wherein the first direction of the fingerprint module is a direction parallel to a particular edge of the fingerprint module and the first direction of the fingerprint sensor is a direction parallel to a particular edge of the fingerprint sensor.

In one possible implementation manner, the first angle is between −15 degrees and 15 degrees and is not equal to zero.

In one possible implementation manner, the first angle is between −45 degrees and 45 degrees and is not equal to zero.

In one possible implementation manner, in a case where the fingerprint module is mounted below a display screen of an electronic device, the first direction of the fingerprint module is parallel to a first direction of the display screen, wherein the first direction of the display screen is a direction parallel to a particular edge of the display screen.

In one possible implementation manner, the first angle is determined according to a polarization direction of a polarizer in the display screen.

In a five aspect, a preparation method of an electronic device is provided, including:

mounting a fingerprint module below a display screen of the electronic device, so that a first direction of a fingerprint sensor in the fingerprint module has the first angle with a first direction of the display screen, the first direction of the fingerprint sensor is a direction parallel to a particular edge of the fingerprint sensor, and the first direction of the display screen is a direction parallel to a particular edge of the display screen.

In one possible implementation manner, a first direction of the fingerprint module is parallel to the first direction of the display screen, and the first direction of the fingerprint module has the first angle with the first direction of the fingerprint sensor, wherein the first direction of the fingerprint module is a direction parallel to a particular edge of the fingerprint module.

In one possible implementation manner, a first direction of the fingerprint module is parallel to the first direction of the fingerprint sensor, and the first direction of the fingerprint module has the first angle with the first direction of the display screen, wherein the first direction of the fingerprint module is a direction parallel to a particular edge of the fingerprint module.

In one possible implementation manner, the first angle is between −45 degrees and 45 degrees and is not equal to zero.

In one possible implementation manner, the first angle is between −15 degrees and 15 degrees and is not equal to zero.

In one possible implementation manner, the first angle is determined according to a polarization direction of a polarizer in the display screen.

BRIEF DESCRIPTION OF DRAWINGS

FIG. 12 is a schematic flowchart of a preparation method of a fingerprint module according to an embodiment of the present application.

FIG. 13 is a schematic flowchart of a preparation method of an electronic device according to an embodiment of the present application.

DESCRIPTION OF EMBODIMENTS

The technical solutions in embodiments of the present application will be described hereinafter in conjunction with the accompanying drawings.

It should be understood that embodiments of the present application may be applied to an optical fingerprint system, including but not limited to an optical fingerprint identification system and a medical diagnostic product based on optical fingerprint imaging. The embodiments of the present application are only described by taking an optical fingerprint system as an example, which should not constitute any limitation to the embodiments of the present application, and the embodiments of the present application are also applicable to other systems using an optical imaging technology or the like.

As a common application scenario, the optical fingerprint system provided in the embodiments of the present application may be applied to a smart phone, a tablet computer, and another mobile terminal having a display screen or another terminal device; more particularly, in the above-mentioned terminal device, an apparatus for acquiring a fingerprint may specifically be an optical fingerprint apparatus, and it may be disposed in part of an area or an overall area below the display screen, so as to form an under-display optical fingerprint system.

Figure 1:
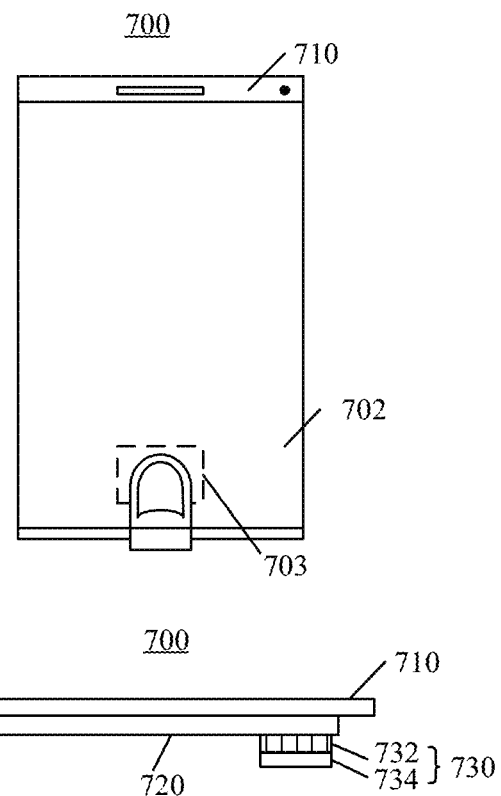
FIG. 1 is a schematic structural diagram of a terminal device applicable to an embodiment of the present application.

FIG. 1 is a schematic structural diagram of a terminal device to which an embodiment of the present application may be applied. The terminal device 700 includes a display screen 720 and an optical fingerprint apparatus 730; the optical fingerprint apparatus 730 is disposed in part of an area below the display screen 720. The optical fingerprint apparatus 730 includes a sensing array having a plurality of optical sensing units, and an area where the sensing array is located is defined as a fingerprint detection area 703 of the optical fingerprint apparatus 730. As shown in FIG. 1, the fingerprint detection area 703 is located in a display area 702 of the display screen 720. With this configuration, when the user needs to unlock the terminal device or perform other fingerprint verification on the terminal device, the fingerprint input may be implemented by pressing the finger on the fingerprint detection area 703 in the display screen 720. Since the fingerprint detection may be realized within the screen, it is not necessary for the terminal device 700 with the above-mentioned structure to particularly reserve a space on a front thereof for arrangement of a fingerprint key (such as a Home key). As such, a full screen solution may be adopted, i.e., the display area 702 of the display screen 720 may be substantially extended to an entire front of the terminal device 700.

As a preferred embodiment, the display screen 720 may adopt a display screen having self-luminous display units, such as an organic light-emitting diode (OLED) display screen or a micro-LED display screen. By adopting the OLED display screen as an example, the optical fingerprint apparatus 730 may utilize display pixel units (i.e., OLED light sources) of the OLED display screen 720, which are located in the fingerprint detection area 703, as an excitation light source for the optical fingerprint detection. Moreover, the sensing array of the optical fingerprint apparatus 730 is in particular a photo detector array including a plurality of photo detectors distributed as an array, and the photo detectors may serve as the optical sensing unit as mentioned above. When a finger presses the fingerprint detection area 703, light emitted from the display pixel units of the fingerprint detection area 703 is reflected on the fingerprint of the surface of the finger and forms reflected light; reflected light at ridges and valleys of the fingerprint is different, and the reflected light returns to the display screen 720 and is received by the photo detector array and converted into a corresponding electrical signal, i.e., a fingerprint detection signal. Fingerprint image data may be obtained based on the fingerprint detection signal, and the fingerprint matching verification may be further performed, such that the optical fingerprint identification function is realized in the terminal device 700.

It should be understood that, on specific implementation, the terminal device 700 further includes a transparent protective cover plate 710 which may be a glass cover plate or a sapphire cover plate; the transparent protective plate 710 is arranged above the display screen 720 and covers the front of the terminal device 700. Because, in the embodiment of the present application, the so-called finger pressing on the display screen 720 actually refers to pressing on the cover plate 710 over the display screen 720 or a protective layer surface covering the cover plate 710.

As an optional implementation manner, as shown in FIG. 1, the optical fingerprint apparatus 730 includes a light detecting section 734 and an optical member 732. The light detecting section 734 includes the sensing array as well as a readout circuit and other auxiliary circuits electrically connected with the sensing array; the light detecting section 734 can be formed as a die via a semiconductor process. The optical member 732 may be arranged above the sensing array of the light detecting section 734, and may specifically include a filter, a light directing layer, and other optical elements. The filter may be configured to filter out the ambient light that penetrates the finger, and the light directing layer is mainly configured to guide the reflected light reflected from the surface of the finger to the sensing array for optical detection.

In specific implementation, the optical member 732 and the light detecting portion 734 may be encapsulated in the same optical fingerprint chip. The light directing layer may specifically be a collimator layer or a lens layer made on a semiconductor silicon wafer, the light directing layer has a plurality of collimating units or lens units, and the collimating units may specifically be small holes; and in the reflected light reflected from the finger, light that is incident perpendicularly to the collimating units can pass through and be received by the optical sensing units below the collimating units, while light that is obliquely incident is attenuated through multiple reflection inside the collimating units, and thus each optical sensing unit can only basically receive reflected light reflected from fingerprint lines right above it, so that the sensing array can detect a fingerprint image of the finger.

In the optical fingerprint apparatus 730, each collimating unit or lens unit may respectively correspond to one of the optical sensing units of the sensing array; alternatively, a non-one-to-one correspondence relationship may also be used between the collimator units or the lens units and the optical sensing units of the sensing array to reduce generation of Moire fringe interference, for example, one optical sensing unit may correspond to a plurality of collimating units or lens units, or the collimating units or the lens units may also adopt a manner of an irregular arrangement; and the collimating units or the lens units that adopt the irregular arrangement may correct reflected light detected by each sensing unit through a post-software algorithm.

In other alternative implementation manner manners, the display screen 720 may also use a non-self-luminous display screen, such as a liquid crystal display screen using backlight. In this case, the optical detection apparatus 730 may not use the display pixel units of the display screen 720 as an excitation light source, and thus an excitation light source needs to be integrated inside the optical detection apparatus 730 or arranged outside the optical detection apparatus 730, so as to realize the optical fingerprint detection.

It should be understood that the optical fingerprint apparatus in the embodiments of the present application may also be referred to as an optical fingerprint identifying module, a fingerprint identification apparatus, a fingerprint identifying module, a fingerprint module, a fingerprint capturing apparatus, or the like, and the foregoing terms may be replaced with each other.

It should also be understood that the technical solutions of the embodiments of the present application can perform other biometric identification in addition to fingerprint identification, for example, vein identification or a living body identification, and the like, which is not limited in the embodiments of the present application.

Figure 2:
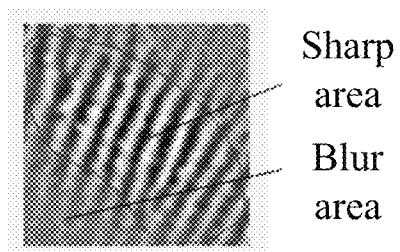
FIG. 2 is a schematic diagram of a captured fingerprint image.

In practical applications, due to the influence of the polarizer and the dot matrix arrangement in the display screen, the captured fingerprints usually have a problem of sharp diagonal and partial blur. As shown in FIG. 2, the blur region has a great influence on fingerprint identification and may cause failure in fingerprint identification and affect the user experience.

In view of this, the embodiment of the present application proposes a solution in which a fingerprint sensor in a fingerprint module (corresponding to the aforementioned DIE, that is, a portion for performing light detection) and a display screen of an electronic device are adjusted to form a certain angle, so that the influence of the polarizer on the optical signal can be effectively reduced and the Moire stripes can also be significantly reduced or eliminated.

The fingerprint module in the embodiments of the present application will be described hereinafter in conjunction with FIG. 3 to FIG. 6.

Figure 3:
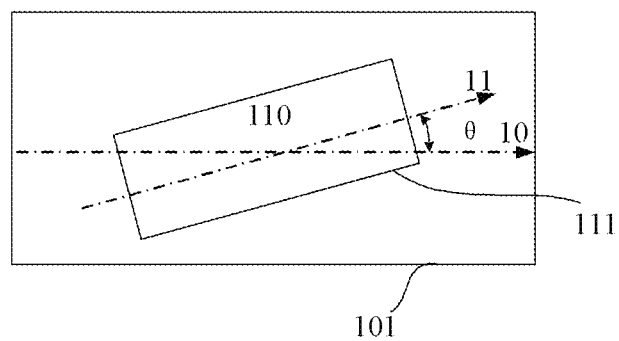
FIG. 3 is a schematic structural diagram of a fingerprint module according to an embodiment of the present application.

FIG. 3 is a schematic structural diagram of a fingerprint module 100 according to an embodiment of the present application. As shown in FIG. 3, the fingerprint module 100 may include a fingerprint sensor 110, wherein a first direction 11 of the fingerprint sensor 110 has a first angle θ with a first direction 10 of the fingerprint module.

It should be noted that the first direction 11 of the fingerprint sensor 110 may be a direction parallel to a particular edge 111 of the fingerprint sensor. Similarly, the first direction 10 of the fingerprint module 100 may be a direction parallel to a particular edge 101 of the fingerprint module.

In a specific embodiment, if the fingerprint sensor and the fingerprint module are rectangles, the particular edge of the fingerprint module or the fingerprint sensor can be a long edge of the rectangle, and the first direction of the fingerprint module or the fingerprint sensor may be a direction parallel to the long edge of the fingerprint module or the fingerprint sensor.

In other optional implementation manners, the first direction of the fingerprint module may also refer to other edges of the fingerprint module, the central axis, and the like as a reference, and similarly, the same goes to the first direction of the fingerprint sensor, which is not limited by the embodiments of the present application, as long as the fingerprint sensor has a certain angle relative to the shape of the fingerprint module.

It should be understood that the embodiments of the present application introduce the concept of the particular edge only to explicitly indicate the positional relationship of the fingerprint sensor in the fingerprint module, which does not mean that the shape of the fingerprint module and the fingerprint sensor must be a standard square or rectangle. When the fingerprint module or the fingerprint sensor is in other irregular shapes, a virtual edge or an axis such as a central axis of the fingerprint module or the fingerprint sensor may serve as a reference, which is not limited in the embodiments of the present application, as long as, with respect to the positional relationship between the current fingerprint sensor and the fingerprint module, the fingerprint sensor has a certain deflection relative to the fingerprint module.

Therefore, in the prior art, the fingerprint sensor is parallelly placed in the fingerprint module, or the shape of the fingerprint sensor is parallel with the shape of the fingerprint module. However, in the embodiments of the present application, the fingerprint sensor has a certain angle with the fingerprint module, that is, the shape of the fingerprint module has a certain angle with the shape of the fingerprint module. In this case, the interference of the polarizer on the fingerprint image can be reduced, and the fingerprint image captured by the fingerprint module is clearer, thus improving the performance of fingerprint identification.

Optionally, in some embodiments, the angle between the fingerprint sensor and the fingerprint module may be obtained by rotating the fingerprint sensor focusing on the center of the fingerprint sensor, or obtained by rotating the fingerprint sensor focusing on the center of the fingerprint module, or obtained by rotating the fingerprint sensor around a corner of the fingerprint module, which is not limited in the embodiments of the present application, as long as the fingerprint sensor has a certain angle relative to the shape of the fingerprint module.

Therefore, by setting a certain angle between the fingerprint sensor and the fingerprint module, there is also an angle between the fingerprint sensor and the display screen of the electronic device correspondingly in a case where the fingerprint module is parallelly mounted on the electronic device, so that it is possible to reduce the influence of the polarizer in the display screen on the optical signal, and at the same time reduce or eliminate the Moire stripes and improve the success rate of fingerprint identification.

Optionally, in some embodiments, the first angle θ may be between −45 degrees and 45 degrees, and is not equal to zero, that is, −45°≤θ<0, or 0<θ≤45°.

Preferably, the first angle θ may be between −15 degrees and 15 degrees, and is not equal to zero, that is, −15°≤θ<0, or 0<θ≤15°.

Optionally, in some embodiments, in a case where the fingerprint module is mounted below the display screen of the electronic device, the first direction of the fingerprint module is parallel to a first direction of the display screen, wherein the first direction of the display screen is a direction parallel to a particular edge of the display screen.

It should be understood that the particular edge of the display screen may be a short edge of the display screen, or an edge parallel to the ground when the electronic device is placed vertically. That is, when the electronic device is placed vertically, the first direction of the display screen is a direction parallel to the ground, which may be referred to as a horizontal direction of the display screen, and the direction of the long edge of the display screen is the vertical direction of the display screen.

Figure 4:
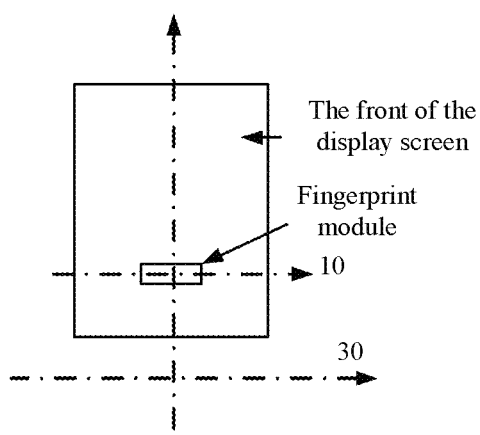
FIG. 4 is a schematic diagram of a mounting angle of the fingerprint module of FIG. 3 in an electronic device.

In a specific application, the fingerprint module can be mounted below the display screen in the electronic device along the first direction parallel to the display screen, such that the first direction of the fingerprint module and the first direction of the display screen are parallel. As shown in FIG. 4, the first direction 30 of the display screen is parallel to the first direction 10 of the fingerprint module. With the fingerprint module 100 of the embodiment of the present application, the fingerprint sensor in the fingerprint module already has a certain angle relative to the fingerprint module itself. Therefore, when mounting the fingerprint module in the electronic device, it is not necessary to adjust an mounting angle of the fingerprint module in the electronic device, so that the mounting of the electronic device can be facilitated, which is better compatible with the current mounting technology of the electronic device at the same time.

In some optional embodiments, in a case where the fingerprint module is mounted below the display screen of the electronic device, the first direction of the fingerprint module may also have a certain angle with the first direction of the display screen, that is, it is not necessary to mount the fingerprint module in parallel to the first direction of the display screen. For example, the fingerprint module can be mounted below the display screen after being rotated clockwise by a degree of α, so that the first direction of the fingerprint module has an angle α with the first direction of the display screen. In the fingerprint module, the angle between the first direction of the fingerprint sensor and the first direction of the fingerprint module is θ, and the angle between the first direction of the fingerprint sensor and the first direction of the display screen is θ+α. In this case, as long as the θ+α is within the above range of angles, the angle between the first direction of the fingerprint module and the first direction of the display screen is not specifically limited in the embodiments of the present application.

Figure 5:
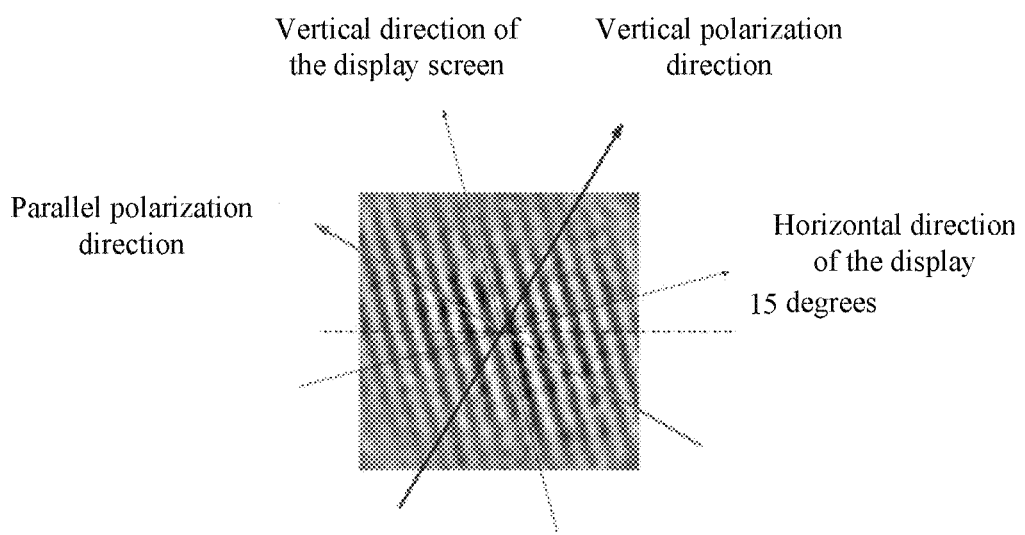
FIG. 5 is a schematic diagram of a fingerprint image captured by a fingerprint sensor after an angle is adjusted.

FIG. 5 is a schematic diagram of a fingerprint image captured in a case where the fingerprint module 100 is parallelly mounted below the display screen of the electronic device. In the example shown in FIG. 5, the angle between the first direction of the fingerprint sensor and the first direction (horizontal direction when placed vertically) of the display screen is 15 degrees. As can be seen from FIG. 5, a sharpness of the fingerprint image captured by the fingerprint sensor after the angle is adjusted is improved with respect to the fingerprint image shown in FIG. 2.

As can be seen from FIG. 5, in the fingerprint image captured by the fingerprint sensor, the fingerprint image parallel or approximately parallel to a polarization direction of a polarizer in the display screen is generally clearer, and the fingerprint image perpendicular or approximately perpendicular to the polarization direction is relatively fuzzy. Therefore, the angle between the fingerprint sensor and the display screen can be set according to the polarization direction of the polarizer to reduce the influence of the polarizer in the display screen on the fingerprint imaging.

It should be understood that, in the embodiments of the present application, the fingerprint module 100 may correspond to the optical fingerprint apparatus 730 in FIG. 1, the fingerprint sensor 110 may correspond to the light detecting portion 734 in FIG. 1, the electronic device may correspond to the terminal device 700, and the display screen may correspond to the display screen 720. Therefore, the fingerprint module 100 can further include modules in the optical fingerprint apparatus 730, such as a filter, a light directing layer, and other optical components, which will not be further described herein.

Figure 6:
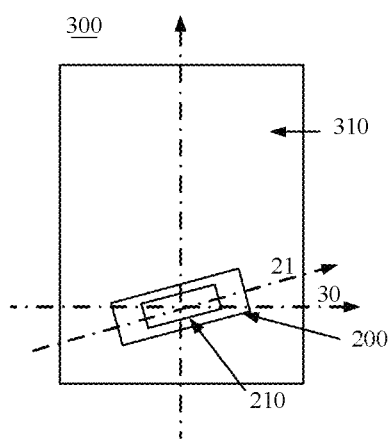
FIG. 6 is a schematic structural diagram of a fingerprint module according to another embodiment of the present application.

FIG. 6 is a schematic structural diagram of a fingerprint module according to another embodiment of the present application. As shown in FIG. 6, the fingerprint module 200 includes: a fingerprint sensor 210;

wherein in a case where the fingerprint module 200 is mounted below a display screen 310 of an electronic device 300, a first direction 21 of the fingerprint sensor 210 in the fingerprint module 200 has a first angle with a first direction 30 of the display screen, the first direction 21 of the fingerprint sensor is a direction parallel to a particular edge of the fingerprint sensor, and the first direction 30 of the display screen is a direction parallel to a particular edge of the display screen.

It should be understood that, in this embodiment, the first direction of the fingerprint sensor, the first direction of the display screen, and the first direction of the fingerprint module have similar meanings as those in the foregoing embodiments, so that details are not described herein again.

In this embodiment, in a case where the fingerprint module 200 is mounted below the display screen, the fingerprint sensor in the fingerprint module has a certain angle relative to the display screen. That is, with respect to the positional relationship between the current fingerprint sensor and the display screen, there is a deflection angle between the fingerprint sensor and the display screen in the embodiment of the present application. The angle may be generated from deflection of the fingerprint module relative to the display screen, or may be, as described in the foregoing embodiment, generated from deflection of the fingerprint sensor relative to the fingerprint module when preparing the fingerprint module, which is not limited in this embodiment of the present application.

To sum up, in this embodiment, the relative angles of the fingerprint module, the fingerprint sensor, and the display screen may include the following cases:

Case 1, the first direction of the fingerprint module is parallel to the first direction of the fingerprint sensor, and the first direction of the fingerprint module has a first angle with the first direction of the display screen.

In this case, the angle between the first direction of the fingerprint sensor and the first direction of the display screen may be generated by rotating the entire fingerprint module.

Case 2, the first direction of the fingerprint module is parallel to the first direction of the display screen, and the first direction of the fingerprint module has a first angle with the first direction of the fingerprint sensor.

In this case, the angle between the first direction of the fingerprint sensor and the first direction of the display screen may be generated by rotating the fingerprint sensor when preparing the fingerprint module, such that when the fingerprint module is mounted along the first direction of the display screen, there must be a certain angle between the first direction of the fingerprint sensor and the first direction of the display screen.

In case 3, the first direction of the fingerprint module has a certain angle with the first direction of the display screen, and the first direction of the fingerprint module has a certain angle with the first direction of the fingerprint sensor.

In this case, the first direction of the fingerprint sensor has a certain angle with the first direction of the fingerprint module when preparing the fingerprint module, and the first direction of the fingerprint module also has a certain angle with the first direction of the display screen when mounting the fingerprint module, as long as it is finally ensured that the angle between the first direction of the fingerprint sensor and the first direction of the display screen is within a certain range.

It should be noted that, in the embodiment of the present application, that the fingerprint sensor has a certain angle with the fingerprint module may mean that the first direction of the fingerprint sensor has a certain angle with the first direction of the fingerprint module. Similarly, the angle between the fingerprint sensor and the display screen can be understood as the angle between the first direction of the fingerprint sensor and the first direction of the display screen. A similar explanation can be provided for similar descriptions, and details are not described herein again.

It should also be understood that when the fingerprint sensor and the fingerprint module are in an irregular shape, that the fingerprint sensor has an angle with the fingerprint module can be understood as that the mounting position of the fingerprint sensor has a certain angle of deflection relative to the mounting position of the fingerprint sensor in the current fingerprint module. For example, the fingerprint sensor can be rotated by a particular angle focusing on a center of the fingerprint sensor to form an angle between the fingerprint sensor and the fingerprint module.

Optionally, in some embodiments, the first angle is between −45 degrees and 45 degrees, and is not equal to zero.

Preferably, the first angle θ is between −15 degrees and 15 degrees, and is not equal to zero.

Therefore, by adjusting the angle of the fingerprint sensor in the fingerprint module relative to the fingerprint module, or by adjusting the angle of the fingerprint module relative to the display screen, the fingerprint sensor has a certain angle with the display screen, so that the effect of the polarizer on the optical signal input into the fingerprint module can be reduced, and the Moire stripes can also be reduced or eliminated, thereby improving the success rate of fingerprint identification.

It should be understood that, in the embodiments of the present application, the fingerprint module 200 may correspond to the optical fingerprint apparatus 730 in FIG. 1, the fingerprint sensor 210 may correspond to the light detecting portion 734 in FIG. 1, the electronic device 300 may correspond to the terminal device 700, and the display screen may correspond to the display screen 720. Therefore, the fingerprint module 200 can further include modules in the optical fingerprint apparatus 730, such as a filter, a light directing layer, and other optical components, which will not be further described herein.

Figure 7:
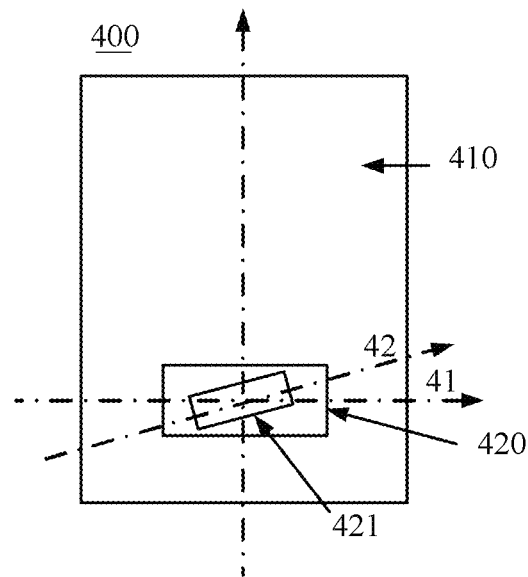
FIG. 7 is a schematic block diagram of an electronic device according to an embodiment of the present application.

FIG. 7 is a schematic structural diagram of an electronic device 400 according to an embodiment of the present application. As shown in FIG. 7, the electronic device 400 includes:

a display screen 410;

a fingerprint module 420 including a fingerprint sensor 421, wherein the fingerprint module 420 is disposed below the display screen 410;

wherein a first direction 42 of the fingerprint sensor 421 has a first angle with a first direction 41 of the display screen 410, a first direction 42 of the fingerprint sensor is a direction parallel to a particular edge of the fingerprint sensor, and the first direction 41 of the display screen 410 is a direction parallel to a particular edge of the display screen.

It should be understood that, in this embodiment, the first direction of the fingerprint sensor, the first direction of the display screen, and the first direction of the fingerprint module have similar meanings as those in the foregoing embodiments, so that details are not described herein again.

In this embodiment, the fingerprint sensor in the electronic device can have a certain angle with the display screen of the electronic device, such that a fingerprint pattern generated through the display screen can generate a certain angle with a pattern generated through the fingerprint sensor. Therefore, the Moire stripes can be reduced or eliminated, and the angle between the fingerprint sensor and the display screen can be set according to a polarization direction of a polarizer in the display screen, which is beneficial to reducing the influence of the polarizer on an optical signal input to the fingerprint module, thereby improving the success rate of fingerprint identification.

Optionally, in some embodiments, the first angle is between −45 degrees and 45 degrees, and is not equal to zero.

Preferably, the first angle is between −15 degrees and 15 degrees, and is not equal to zero.

Optionally, in some embodiments, the display screen may be an OLED screen or a liquid crystal display screen.

To sum up, in some embodiments, the relative angles of the fingerprint module, the fingerprint sensor, and the display screen may be in the foregoing cases 1-3, which is not described herein again.

Figure 8:
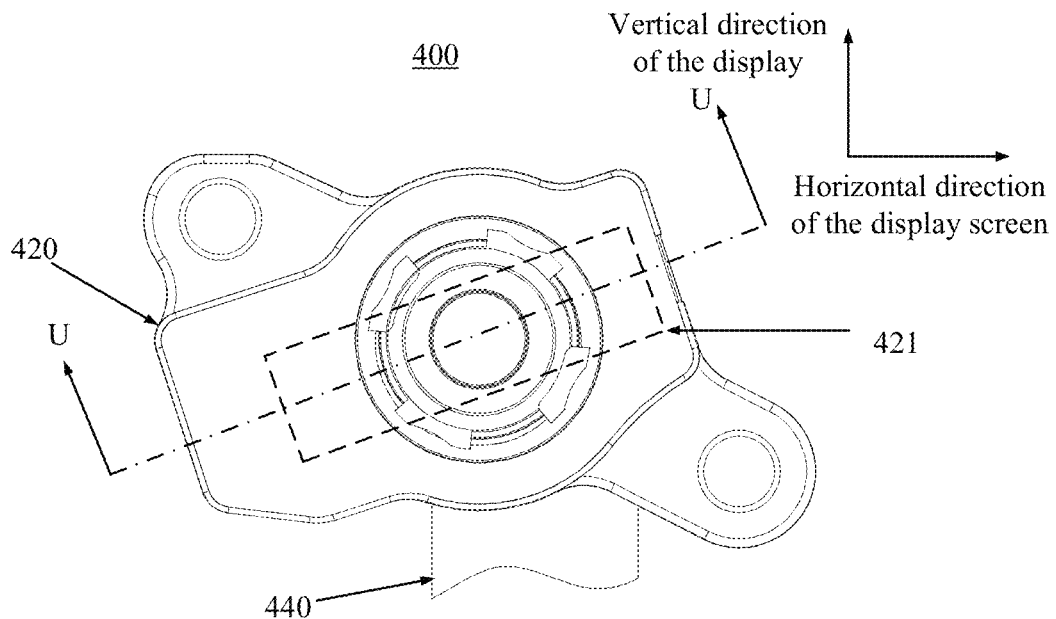
FIG. 8 is an oriented diagram of an electronic device according to an embodiment of the present application.
Figure 9:
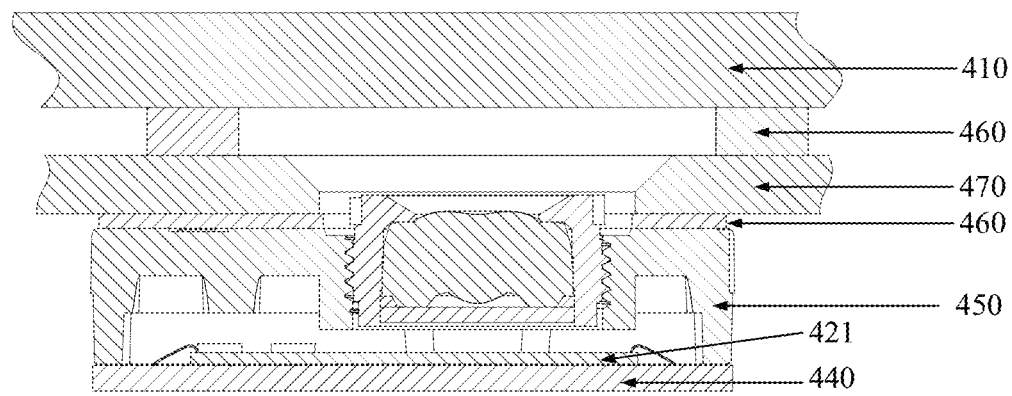
FIG. 9 is a partial cross-sectional schematic structural diagram of the electronic device shown in FIG. 8 taken along U-U.
Figure 10:
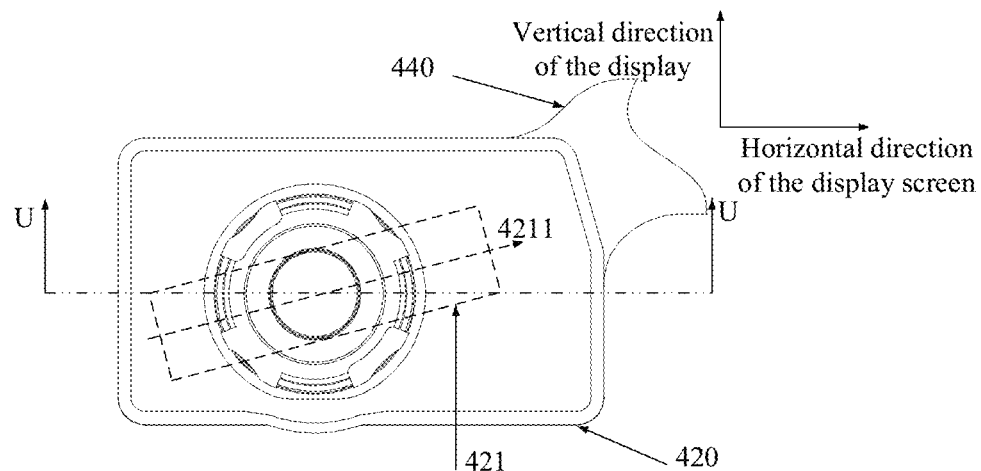
FIG. 10 is an oriented diagram of an electronic device according to another embodiment of the present application.
Figure 11:
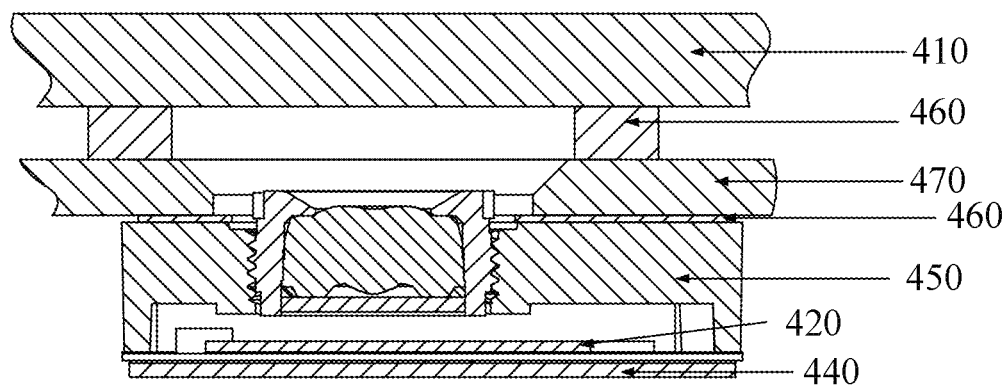
FIG. 11 is a partial cross-sectional schematic structural diagram of the electronic device shown in FIG. 10 taken along U-U.

FIG. 8 is an oriented diagram of an electronic device 400 in case 1. FIG. 9 is a partial cross-sectional schematic structural diagram of the electronic device 400 shown in FIG. 8 taken along U-U. FIG. 10 is an oriented diagram of an electronic device 400 in case 2. FIG. 11 is a partial cross-sectional schematic diagram of the electronic device 400 shown in FIG. 10 taken along U-U.

In FIG. 8, a first direction of the fingerprint module 420 is parallel to a first direction of the fingerprint sensor 421, and the first direction of the fingerprint module 420 has a certain angle with a first direction (a horizontal direction when the electronic device is placed vertically) of the display screen.

For the electronic device shown in FIG. 8, an existing preparation process can be applied to the fingerprint module in the electronic device. However, the preparation process of the electronic device is different from that of the existing electronic device. In order that the fingerprint sensor in the fingerprint module has an angle with the display screen, the entire fingerprint module needs to be rotated when the fingerprint module is mounted in a middle frame below the display screen of the electronic device, so that the angle between the fingerprint sensor in the fingerprint module and the display screen is within a particular range. In this embodiment, since the fingerprint module needs to be rotated in the middle frame, it is necessary to reserve sufficient space for the fingerprint module.

In FIG. 10, a first direction of the fingerprint module 420 is parallel to a first direction of the screen display, and the first direction of the fingerprint module 420 has a certain angle with a first direction (a horizontal direction when the electronic device is placed vertically) of the fingerprint sensor 421.

For the electronic device shown in FIG. 10, an existing preparation process can be applied to the electronic device. However, the preparation process of the fingerprint module is different from the existing preparation process. In order that the fingerprint sensor in the fingerprint module has a certain angle with the display screen, the fingerprint sensor may be rotated when preparing the fingerprint module, so that the fingerprint sensor in the fingerprint module has a certain angle relative to a shape of the fingerprint module. In this way, in a case where the fingerprint module is mounted in a middle frame below the display screen of the electronic device along a first direction parallel to the display screen, the fingerprint sensor in the fingerprint module has a certain angle with the display screen.

In this embodiment, since a rotation occurs for the fingerprint module with respect to the fingerprint sensor, it is necessary to reserve sufficient space for rotating the fingerprint sensor.

As shown in FIG. 9 and FIG. 11, the electronic device further includes other components, such as a flexible printed circuit (FPC) 440, a bracket 450, a foam 460, a middle frame 470, and the like.

Specifically, the foam 460 is disposed on an upper surface of the bracket 450, and the foam 460 can be used to seal dust. The middle frame 470 is a frame of an electronic device that is disposed between the display screen 410 and a back cover and is used for carrying various components therein, and the various components therein include, but are not limited to, a battery, a main board, a camera, a flex cable, various sensors, a microphone, an earphone, or the like.

The fingerprint sensor 421 can be soldered to the FPC 440 through a pad, and achieve electrical interconnection and signal transmission with other peripheral circuits or other elements of the electronic device as shown in FIG. 6 or FIG. 7 through the FPC 440. For example, the fingerprint sensor may receive a control signal of a processing unit of the electronic device through the FPC 440, and may also output a fingerprint image captured by the fingerprint sensor 421 to the processing unit, a control unit or the like of the electronic device through the FPC 440.

The apparatus embodiments according to the present application are described in detail with reference to FIG. 3 to FIG. 11. Hereinafter, the method embodiments according to the present application will be described with reference to FIG. 12 and FIG. 13. It should be understood that the method embodiments and the apparatus embodiments correspond to each other. For similar descriptions, reference may be made to the foregoing apparatus embodiments, and details are not described herein again.

It should be understood that the preparation methods for the fingerprint module and the electronic device shown as follows are only possible implementation manners for implementing the fingerprint module and the electronic device in the embodiments of the present application, and shall not constitute any limitation to the present application. The embodiments of the present application may also adopt other preparation methods to prepare the above structure.

It should be further understood that, FIGS. 12 and 13 illustrate steps or operations of the method for preparing the fingerprint module and the electronic device of the embodiment of the present application, which are merely examples, and other operations or variants of various operations of FIGS. 12 and 13 may also be executed in the embodiments of the present application. In addition, the steps in FIGS. 12 and 13 may be executed according to an order different from that are presented in FIGS. 12 and 13, respectively, and moreover, it may be unnecessary to implement all of the operations in FIGS. 12 and 13.

FIG. 12 is a schematic flowchart of a preparation method 500 of a fingerprint module according to an embodiment of the present application. As shown in FIG. 12, the method 500 includes the following contents:

S510, mounting a fingerprint sensor in the fingerprint module along a direction forming a first angle with a first direction of the fingerprint module, so that the first direction of the fingerprint sensor has a first angle with the first direction of the fingerprint module, wherein the first direction of the fingerprint module is a direction parallel to a particular edge of the fingerprint module, and the first direction of the fingerprint sensor is a direction parallel to a particular edge of the fingerprint sensor.

Optionally, in some embodiments, the first angle is between −15 degrees and 15 degrees, and is not equal to zero.

Optionally, in some embodiments, the first angle is between −45 degrees and 45 degrees, and is not equal to zero.

Optionally, in some embodiments, in a case where the fingerprint module is mounted below the display screen of the electronic device, the first direction of the fingerprint module is parallel to a first direction of the display screen, wherein the first direction of the display screen is a direction parallel to a particular edge of the display screen.

Optionally, in some embodiments, the first angle is determined according to a polarization direction of a polarizer in the display screen.

FIG. 13 is a schematic flowchart of a preparation method 600 of an electronic device according to an embodiment of the present application. As shown in FIG. 13, the method 600 includes the following contents:

S610, mounting a fingerprint module below a display screen of the electronic device, so that a first direction of a fingerprint sensor in the fingerprint module has a first angle with a first direction of the display screen, the first direction of the fingerprint sensor is a direction parallel to a particular edge of the fingerprint sensor, and the first direction of the display screen is a direction parallel to a particular edge of the display screen.

Optionally, in some embodiments, a first direction of the fingerprint module is parallel to the first direction of the display screen, and the first direction of the fingerprint module has the first angle with the first direction of the fingerprint sensor, wherein the first direction of the fingerprint module is a direction parallel to a particular edge of the fingerprint module. Corresponding to the foregoing case 2, the specific execution process will not be described again herein.

Optionally, in some embodiments, a first direction of the fingerprint module is parallel to the first direction of the fingerprint sensor, and the first direction of the fingerprint module has the first angle with the first direction of the display screen, wherein the first direction of the fingerprint module is a direction parallel to a particular edge of the fingerprint module. Corresponding to the foregoing case 1, the specific execution process will not be described again herein.

Optionally, in some embodiments, the first angle is between −45 degrees and 45 degrees, and is not equal to zero.

Optionally, in some embodiments, the first angle is between −15 degrees and 15 degrees, and is not equal to zero.

Optionally, in some embodiments, the first angle is determined according to a polarization direction of a polarizer in the display screen.

It should also be understood that, each embodiment of the preparation methods listed above may be performed by a robot or numerical control machine, etc. The device software or process for performing the preparation methods may perform the foregoing preparation methods by executing the computer program code stored in the memory.

It should be understood that, in various embodiments of the present application, values of sequence numbers of the above-mentioned various processes do not mean an order of execution which should be determined based upon functionalities and internal logics thereof, rather than setting any limitation to implementation of the embodiments of the present application.

Those of ordinary skill in the art may be aware that, units and algorithm steps of the examples described in the embodiments disclosed in this paper may be implemented by electronic hardware, or a combination of computer software and the electronic hardware. Whether these functions are executed in hardware or software mode depends on the specific applications and design constraint conditions of the technical solution. Those skilled may implement the described functions by using different methods for each specific application, but this implementation should not be considered to be beyond the scope of the present application.

Those skilled in the art to which the present disclosure pertains may clearly understand that, for convenience and simplicity of description, for the specific working processes of the system, the apparatus and the units described above, may refer to corresponding processes in the foregoing method embodiments, and will not be repeated redundantly herein.

In the several embodiments provided in the present application, it should be understood that the disclosed system, apparatus, and method may be implemented in another manner. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate components may or may not be physically separate, and components displayed as units may or may not be physical units, may be located in one position, or may be distributed on multiple network units. Some or all of the units may be selected according to actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present application essentially, or the part contributing to the prior art, or some of the technical solutions, may be implemented in a form of a software product. The software product is stored in a storage medium and includes several instructions for instructing a computer device (which may be a personal computer, a server, a network device, or the like) to perform all or some of the steps of the methods described in the embodiments of the present application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific embodiments of the present application, but the protection scope of the present application is not limited thereto, persons skilled in the art who are familiar with the art could readily think of variations or substitutions within the technical scope disclosed by the present application, and these variations or substitutions shall fall within the protection scope of the present application. Therefore, the protection scope of this application shall be subject to the protection scope of the claims.

What is claimed is:

1. An optical fingerprint apparatus, applicable to an electronic device having a display screen, the optical fingerprint apparatus comprising:
    a fingerprint sensor comprising a sensing array with a plurality of optical sensing units, wherein the optical sensing units are configured to receive light that is generated when a finger above the display screen is illuminated, and to convert the light into fingerprint detection signals so as to obtain a fingerprint image of the finger;
    wherein the fingerprint sensor being structured to be arranged under the display screen in such a manner that the sensing array is distributed along an axis parallel to a first direction of the fingerprint sensor having a predetermined angle relative to a specific direction of the display screen, wherein the specific direction refers to a direction parallel to a particular edge of the display screen, the first direction is parallel to a particular edge of the fingerprint sensor, and the predetermined angle is about 15 degrees;
    wherein the optical fingerprint apparatus further comprises a bracket and a flexible printed circuit, wherein the bracket is arranged on the flexible printed circuit to form an accommodating space, and the fingerprint sensor is mounted on the flexible printed circuit and received in the accommodating space;
    wherein the optical fingerprint apparatus further comprises a foam, wherein the bracket is attached to a lower surface of a middle frame of the electronic device, the middle frame is arranged between the display screen and a back cover of the electronic device, and is used for carrying components in the electronic device; and
    wherein the middle frame is formed with an opening in an installation area of the optical fingerprint apparatus, and the bracket is arranged under the opening and attached to the lower surface of the middle frame, so that there is a gap between the optical fingerprint apparatus and the display screen.

2. The optical fingerprint apparatus according to claim 1, wherein the display screen is an OLED display screen comprising a plurality of display pixel units, and the finger above the OLED display screen is illuminated by some display pixel units of the OLED display screen to generate the light, wherein the light comprising reflected light of a surface of the finger.

3. The optical fingerprint apparatus according to claim 1, wherein the fingerprint sensor is a rectangle fingerprint sensor, the sensing array is distributed along an axis that is parallel to a long edge of the rectangle fingerprint sensor, and the display screen is arranged to have a short edge parallel to a ground plane when the electronic device is placed vertically, wherein the long edge of the rectangle fingerprint sensor have the predetermined angle relative to the short edge of the display screen.

4. The optical fingerprint apparatus according to claim 1, wherein the predetermined angle between the axis of the sensing array and the specific direction of the display screen is adapted to reduce Moire stripes in the fingerprint image or influence of a polarizer in the display screen on the light received by the fingerprint sensor.

5. The optical fingerprint apparatus according to claim 1, wherein the optical fingerprint apparatus has a second direction parallel to a particular edge of the optical fingerprint apparatus, the first direction of the fingerprint sensor is parallel to the second direction of the optical fingerprint apparatus, and the optical fingerprint apparatus is arranged in such a manner that the second direction of the optical fingerprint apparatus has the predetermined angle relative to the specific direction of the display screen.

6. The optical fingerprint apparatus according to claim 1, wherein the optical fingerprint apparatus has a second direction parallel to a particular edge of the optical fingerprint apparatus, the optical fingerprint apparatus is arranged in such a manner that the second direction of the optical fingerprint apparatus is parallel to the specific direction of the display screen, and the first direction of the fingerprint sensor have the predetermined angle relative to the second direction of the optical fingerprint apparatus.

7. The optical fingerprint apparatus according to claim 1, wherein the optical fingerprint apparatus has a second direction parallel to a particular edge of the optical fingerprint apparatus, the first direction of the fingerprint sensor has a first angle relative to the second direction of the optical fingerprint apparatus, and the second direction of the optical fingerprint apparatus has a second angle relative to the specific direction of the display screen, wherein the first angle and the second angle cooperatively form the predetermined angle between the first direction of the fingerprint sensor and the specific direction of the display screen.

8. The optical fingerprint apparatus according to claim 1, further comprising an optical member arranged above the sensing array of the fingerprint sensor, wherein the optical member comprises a light directing layer for guiding the light to the sensing array, and a filter layer for filtering out ambient light that penetrates the finger.

9. The optical fingerprint apparatus according to claim 8, wherein the light directing layer comprises a collimator layer having a plurality of collimating units, each of the collimating units corresponds to a respective optical sensing unit of the sensing array; the collimating units are configured for allowing light having an incident angle corresponding to the collimating units to pass through and reach the optical sensing units, while attenuating light have other incident angles; or the light directing layer comprises a lens layer to guiding the light to be transmitted to the sensing array to obtain the fingerprint image.

10. An electronic device for implement under display fingerprint detection, comprising:

a display screen comprising a plurality of display pixel units arranged along a first axis parallel to a particular edge of the display screen; and an optical fingerprint apparatus arranged under the display screen, the optical fingerprint apparatus comprising a fingerprint sensor having a sensing array, the sensing array comprising a plurality of optical sensing units distributed along a second axis parallel to a first direction of the fingerprint sensor having a predetermined angle relative to the first axis of the display screen, the first direction of the fingerprint sensor is parallel to a particular edge of the fingerprint sensor, and the predetermined angle is about 15 degrees;

wherein the optical sensing units are configured to receive light that is generated when a finger above the display screen is illuminated by part of the display pixel units, and to convert the light into fingerprint detection signals so as to obtain a fingerprint image of the finger;

wherein the fingerprint sensor is a rectangle fingerprint sensor, the sensing array is distributed along an axis that is parallel to a long edge of the rectangle fingerprint sensor, and the display screen is arranged to have a short edge parallel to a ground plane when the electronic device is placed vertically, wherein the long edge of the rectangle fingerprint sensor have the predetermined angle in relative to the short edge of the display screen;

wherein the predetermined angle is adapted to reduce Moire stripes in the fingerprint image and influence of a polarizer in the display screen on the light received by the fingerprint sensor; and wherein the predetermined angle is determined according to a polarization direction of the polarizer in the display screen and the long edge of the rectangle fingerprint sensor have an angle of 30 degrees relative to the direction of parallel to the polarization direction of the polarizer.

11. The electronic device according to claim 10, wherein the predetermined angle between the first axis of the display screen and the second axis of the sensing array is adapted to reduce Moire stripes in the fingerprint image.

12. The electronic device according to claim 10, wherein the optical fingerprint apparatus has a second direction parallel to a particular edge of the optical fingerprint apparatus, the first direction of the fingerprint sensor is parallel to the second direction of the optical fingerprint apparatus, and the optical fingerprint apparatus is arranged in such a manner that the second direction of the optical fingerprint apparatus has the predetermined angle relative to the first axis of the display screen.

13. The electronic device according to claim 10, wherein the optical fingerprint apparatus has a second direction parallel to a particular edge of the optical fingerprint apparatus, the optical fingerprint apparatus is arranged in such a manner that the second direction of the optical fingerprint apparatus is parallel to the first axis of the display screen, and the first direction of the fingerprint sensor have the predetermined angle relative to the second direction of the optical fingerprint apparatus.

14. An optical fingerprint apparatus, applicable to an electronic device having a display screen, the optical fingerprint apparatus comprising:

a fingerprint sensor comprising a sensing array with a plurality of optical sensing units, wherein the optical sensing units are configured to receive light that is generated when a finger above the display screen is illuminated, and to convert the light into fingerprint detection signals so as to obtain a fingerprint image of the finger;

wherein the fingerprint sensor being structured to be arranged under the display screen in such a manner that the sensing array is distributed along an axis parallel to a first direction of the fingerprint sensor having a predetermined angle relative to a specific direction of the display screen, wherein the specific direction refers to a direction parallel to a particular edge of the display screen, the first direction is parallel to a particular edge of the fingerprint sensor, and the predetermined angle is about 15 degrees;

wherein the fingerprint sensor is a rectangle fingerprint sensor, the sensing array is distributed along an axis that is parallel to a long edge of the rectangle fingerprint sensor, and the display screen is arranged to have a short edge parallel to a ground plane when the electronic device is placed vertically, wherein the long edge of the rectangle fingerprint sensor have the predetermined angle relative to the short edge of the display screen; and wherein the predetermined angle is determined according to a polarization direction of the polarizer in the display screen, and the predetermined angle is adapted to reduce Moire stripes in the fingerprint image and influence of a polarizer in the display screen on the light received by the fingerprint sensor.

15. The optical fingerprint apparatus according to claim 14, wherein the long edge of the rectangle fingerprint sensor have an angle of 30 degrees relative to the direction of parallel to the polarization direction of the polarizer.

16. The electronic device according to claim 10, further comprising a middle frame and back cover, the middle frame is arranged between the display screen and the back cover, the middle frame is used for carrying components in the electronic device;

wherein the optical fingerprint apparatus further comprise a bracket and a flexible printed circuit, wherein the bracket is arranged on the flexible printed circuit to form an accommodating space, the fingerprint sensor is mounted on the flexible printed circuit and received in the accommodating space, and the bracket is attached to the lower surface of the middle frame; and the middle frame is formed with an opening in an installation area of the fingerprint identification apparatus, and the fingerprint identification apparatus is arranged under the opening, so that there is a gap between the optical fingerprint apparatus and the display screen.

* * * * *